United States Patent

Yamada et al.

[11] Patent Number: 5,853,907
[45] Date of Patent: Dec. 29, 1998

[54] AROMATIC POLYAMIDE FILM, METHOD FOR PRODUCING THE SAME, AND MAGNETIC RECORDING MEDIUM AND SOLAR CELL USING THE SAME

[75] Inventors: Takashi Yamada; Masayuki Nakatani, both of Nobeoka, Japan

[73] Assignee: Asahi Kasei Kogyo Kabushiki Kaisha, Osaka, Japan

[21] Appl. No.: 793,074
[22] PCT Filed: Aug. 18, 1995
[86] PCT No.: PCT/JP95/01642
§ 371 Date: Feb. 18, 1997
§ 102(e) Date: Feb. 18, 1997
[87] PCT Pub. No.: WO96/06128
PCT Pub. Date: Feb. 29, 1996

[30] Foreign Application Priority Data

Aug. 19, 1994 [JP] Japan ..................................... 6-195484

[51] Int. Cl.$^6$ ...................................................... B32B 27/34
[52] U.S. Cl. .................................. 428/694 SG; 428/143; 428/149; 428/458; 428/474.4; 428/694 SL; 428/900
[58] Field of Search ................................ 428/457, 474.4, 428/900, 458, 694 SL, 694 SG

[56] References Cited

U.S. PATENT DOCUMENTS

| | | | |
|---|---|---|---|
| 3,901,854 | 8/1975 | Jones | 528/348 |
| 4,898,753 | 2/1990 | Inoue et al. | 427/276 |
| 5,302,424 | 4/1994 | Mural et al. | 427/131 |
| 5,527,617 | 6/1996 | Nishikawa et al. | 428/447 |
| 5,597,638 | 1/1997 | Saito et al. | 428/900 |

FOREIGN PATENT DOCUMENTS

| | | |
|---|---|---|
| 61-246919 | 11/1986 | Japan . |
| 2-1741 | 1/1990 | Japan . |
| 4-298324 | 10/1992 | Japan . |
| 6-195679 | 7/1994 | Japan . |

*Primary Examiner*—Tae Yoon
*Attorney, Agent, or Firm*—Finnegan, Henderson, Farabow, Garrett & Dunner, L.L.P.

[57] ABSTRACT

An aromatic polyamide film is disclosed, which contains micro-particles in an amount in a range from 0.001 to 10% by weight, characterized in that, at least on one film surface, a distribution density of projections having a height in a range from 0.01 $\mu$m to 0.05 $\mu$m is in a range from $10^2$ to $10^7$/mm$^2$; that of projections having a height in a range from 0.27 $\mu$m to less than 0.54 $\mu$m is in a range from 0 to 5/cm$^2$; that of projections having a height in a range from 0.54 $\mu$m to less than 0.81 $\mu$m is in a range from 0 to 2/10 cm$^2$; and that of projections having a height of 0.81 $\mu$m or more is in a range from 0 to 0.5/100 cm$^2$. The aromatic polyamide film has both satisfactory slipperiness and surface smoothness, and is suitably used as an electro-insulating material for a high rotational speed electric appliance, a base film for a solar cell, or a flexible printed circuit board. This aromatic polyamide film is prepared by preparing a dispersion of inorganic or organic micro-particles well dispersed in a solvent for the aromatic polyamide, filtering the dispersion, preparing an aromatic polyamide solution while using this dispersion as a solvent, and forming the film from the solution after filtering the solution.

22 Claims, 1 Drawing Sheet

AROMATIC POLYAMIDE FILM, METHOD FOR PRODUCING THE SAME, AND MAGNETIC RECORDING MEDIUM AND SOLAR CELL USING THE SAME

TECHNICAL FIELD

The present invention relates to an aromatic polyamide film having a slippery smooth surface and good mechanical properties, and a method for producing the same. As the aromatic polyamide film according to the present invention is excellent in electrical insulation, resistance to heat, resistance to chemicals and resistance to climate, and also has particularly high elastic modulus, slipperiness and surface smoothness, it is suitable to be used as a base film of a recording medium such as a video tape, audio tape or computer tape and as a substrate on which a deposition layer is formed by a sputtering method.

BACKGROUND ART

An aromatic polyamide (hereinafter referred to as an aramid) is a polymeric material which has recently been highlighted because of its good crystallinity and high melting point as well as its excellent resistance to heat and high mechanical strength due to the rigid molecular structure thereof. Also the aramid is better in mechanical properties such as rigidity or mechanical strength compared with other polymers, and is thought to be very suitable for forming a film having a smaller thickness, and therefore it is expected to be used as a material for a magnetic tape, photographic film, printer ink sheet, solar cell base film, substrate film for a flexible printed circuit, electrical insulation film or capacitor film.

In this regard, for enhancing the production of the aramid film and the application thereof to the above uses, it is necessary to improve the slipperiness. That is, if the film lacks slipperiness, the winding, unwinding, coating or slitting operation become troublesome, which may cause wrinkles or scratches on the film surface or generate static to attract dust. There have been various proposals for providing projections on the film surface to improve the slipperiness. For example, Japanese Examined Patent Publication (Kokoku) No. 53-23860 describes that a soluble or fluidized sol (such as colloidal silica) is added to a polymer solution, which is positively separated and then agglomerated during the film formation process to improve the slipperiness. Although the slipperiness can be improved to some extent according to this method, the resultant film has too rough a surface to be used as a magnetic tape or the like.

Japanese Examined Patent Publication (Kokoku) No. 5-36849 and Japanese Unexamined Patent Publication (Kokai) No. 2-133434 disclose a film having a number of micro-projections on the surface thereof formed from added micro-particles. However, according to the study made by the present inventors, the slipperiness is not compatible with the surface smoothness in this film. That is, although a base film for a magnetic recording medium having micro-projections of a predetermined size is disclosed in Japanese Kokoku No. 5-36849, there is only one description regarding projections having a height exceeding 50 nm, as a comparative example, in that the electromagnetic transducing characteristic is lowered if a relatively large number of projections having a height in a range from 90 to 180 nm exists. However, there is none regarding larger projections having a substantial influence upon the electromagnetic transducing characteristic. In fact, according to the study made by the present inventors, a particular range of numbers of projections having a height exceeding 50 nm should be defined for establishing the compatibility of the electromagnetic transducing characteristic with the slipperiness. Nevertheless, there is no technology for controlling the number of projections to a predetermined range in the method for producing a film disclosed in Kokoku 5-36849. Therefore, it has been found that a satisfactory base film for high density recording is not obtainable by this known method.

An aramid film having a relatively large number of projections with a relatively large height in a range from 0.06 to 0.25 nm is disclosed in Japanese Kokai 2-133434. However, there is also no description therein regarding larger projections of a height of 0.27 μm or more having a substantial influence upon the electromagnetic transducing characteristic nor a method for controlling the number of larger projections to a predetermined range during the film production.

A polyester film which is quite different both in a mechanical performance and a method of production from the aramid film according to the present invention is disclosed in Japanese Examined Patent Publication (Kokoku) No. 3-74692 wherein there is a description in that it is desirable to exclude so-called super-large projections having a height of 0.87 μm or more for the purpose of using this film as a magnetic recording medium. It was found, however, that a desirable aramid film is not obtainable at all solely by the exclusion of super-large projections as described in this Kokoku, but the number of larger projections having a height in a range between 0.25 and 0.81 μm and that of micro-projections having a height of 0.05 μm or less should be controlled. In addition, there is a significant difference in the generation mechanism of the super-large projections between the aramid film and the polyester film. Namely, in the polyester film, a primary cause of the large projection is deposition of oligomers, and a caldera-like recess is liable to be formed around the large projection since the film is formed at a high draft ratio. On the contrary, in the aramid film, there is neither deposition of oligomers nor formation of the above-mentioned recess. Instead, the surface property of the aramid film is largely related to the state of micro-particles (lubricant) in the film; i.e., concentration, size or distribution of particles and the degree of exclusion of large-sized agglomerates. That is, the dispersion of micro-particles and the filtration of dispersion liquid are very important for the production of the aramid film. Due to such a difference in the generation mechanism of large projections, the polyester film has an extremely large number of large projections compared with the aramid film as shown, for example, in Japanese Unexamined Patent Publication (Kokai) Nos. 58-23323, 60-70517 and 61-209127. Even in a polyester film for a vapor-deposition type magnetic tape wherein the large particles are reduced as much as possible, a considerable number of large particles still exist to prevent the film being used as a base film for a high density recording medium, as disclosed, for example, in Japanese Unexamined Patent Publication (Kokai) Nos. 57-195321, 62-32048, 62-259227, 2-208039, 5-8357 and 5-210872. There is also a proposal wherein, instead of controlling the generation of projections during the production of a polyester film, a film surface is coated after the film formation, as disclosed in Japanese Unexamined Patent Publication No. 3-223351.

In a recently laid-open Japanese Unexamined Patent Publication (Kokai) No. 6-195679, a magnetic tape is disclosed which uses an aramid film having a limited number of large projections of a height of 0.54 μm or more. Since the large projections of this aramid film generate not by the addition of micro-particles but by the surface irregularity of a metallic belt used in the film formation, it is extremely difficult to intentionally control the number of micro-projections to a desirable range, whereby this film is not practical because the slipperiness largely varies even though a proper number of large projections might exist.

In Japanese Unexamined Patent Publication (Kokai) No. 61-246919, there is a description regarding projections of a height of 50 nm high or less as in the Japanese Kokoku 5-36849 cited before, but there is no description of how to control the large projections.

In Japanese Examined Patent Publication (Kokoku) No. 5-64594, Japanese Unexamined Patent Publication (Kokai) Nos. 3-119512, 4-34716 and 3-114830, aramid films are disclosed, which are obtained by a so-called double layer extrusion method. However, no method for controlling the generation of large projections is disclosed.

In Japanese Unexamined Patent Publication (Kokai) Nos. 4-149245 and 4-298324, aramid films having a special surface with a number of micro-projections are disclosed, but there is no description regarding large projections. Although this known method for producing the aramid film discloses filtration of material liquid (dope) which is one of the factors relating to the formation of large projections, there is no sufficient disclosure of how to disperse micro-particles and/or filter the low viscosity dope. According to the supplementary tests made by the present inventors based on the technology disclosed in these Japanese Kokai, it has been found that a film having both desired large projections and micro-projections is not obtainable.

An aramid film technology disclosed in Japanese Unexamined Patent Publication (Kokai) No. 2-1741 is silent on large projections but relates solely to micro-projections. According to this Japanese Kokai, there is a description that a solution is agitated for the purpose of dispersing a so-called lubricant and the resultant low viscosity solution is filtered, but no means effective for preventing the generation of large projections is disclosed.

In Japanese Unexamined Patent Publication (Kokai) No. 63-297038 and the U.S. Pat. No. 4,898,753, polyimide films having a predetermined number and size of micro-projections are disclosed. However, these films may have an unsatisfactory slipperiness when used as a base film for a magnetic recording medium, because there is no definition regarding large projections.

In short, in the prior art disclosing aromatic polyamide films and/or methods for the production thereof, there is no technical idea for controlling large projections on the film surface, except for that disclosed in Japanese Kokai No. 6-195679. Since the technology disclosed in Japanese Kokai No. 6-195679 does not contemplate the control of large projection by adding micro-particles in the film material, as described above, there has been, in the prior art, no technical idea for controlling large projections on a surface of an aromatic polyamide film added and mixed with micro-particles. In addition, any of embodiments in the prior art documents disclosing aromatic polyamide films added and mixed with micro-particles could not have realized the control of large projections, in view of the production methods disclosed therein.

The reasons therefor are that such a control is accompanied with technical difficulties. That is, if one wishes to control the generation of large projections in an aromatic polyamide film by adding micro-particles, it is thought that a first step is the removal of large size particles and/or insufficiently dispersed micro-particles by a filtration. However, the life span of a filter having a required mesh size is unexpectedly short in such a filtration, which is difficult to apply to industrial production. This is because ionic compounds are contained in a solvent itself or an auxiliary thereof, or as polymerization by-products, in the aromatic polyamide solution, which may prevent the micro-particles from dispersing or cause the dispersed micro-particles to be reagglomerated particularly when the same pass through the filter. Such circumstances are largely different from those of the polyester film.

Accordingly, a special technology is necessary in the dispersion and filtration of micro-particles, for realizing an aromatic polyamide film with a surface having both of a required number of micro-projections and that of large projections.

DISCLOSURE OF THE INVENTION

An object of the present invention is to improve a surface characteristic of an aromatic polyamide film excellent in mechanical properties represented by a high strength and a good elastic modulus.

A more concrete object of the present invention is to provide an aromatic polyamide film with the above-mentioned mechanical properties, having high surface slipperiness and smoothness, and a method for producing the same.

Another more concrete object of the present invention is to provide an aromatic polyamide film having an improved surface characteristic with a high elastic modulus and a good mechanical strength, which is suitable for an electro-insulating member of an electric appliance rotatable at a high speed, a recording medium such as a video tape, computer tape or audio tape, and a base film on which a vapor-deposition layer is formed by a sputtering method.

These objects of the present invention are achievable by controlling the distribution of projections, observed on the film surface ranging from a micro size to a large size, to predetermined ranges.

That is, the present invention is an aromatic polyamide film containing organic or inorganic micro-particles in an amount in a range from 0.001 to 10% by weight, characterized in that, at least on one film surface, a distribution density of projections having a height in a range from 0.01 to 0.05 $\mu$m is in a range from $10^2$ to $10^7/mm^2$; that of projections having a height in a range from 0.27 to less than 0.54 $\mu$m is in a range from 0 to 5/cm$^2$; that of projections having a height in a range from 0.54 and less than 0.81 $\mu$m is in a range from 0 to 2/10 cm$^2$; and that of projections having a height of 0.81 $\mu$m or more is in a range from 0 to 0.5/100 cm$^2$.

The aromatic polyamide referred to in the present invention is composed of units selected from a group consisting of the following units:

—NH—Ar$_1$—NH—     (I)

—CO—Ar$_2$—CO—     (II)

—NH—Ar$_3$—CO—     (III)

wherein each of Ar$_1$, Ar$_2$ and Ar$_3$ includes at least one aromatic ring, and may be the same as or different from the other; the following groups being typical examples thereof.

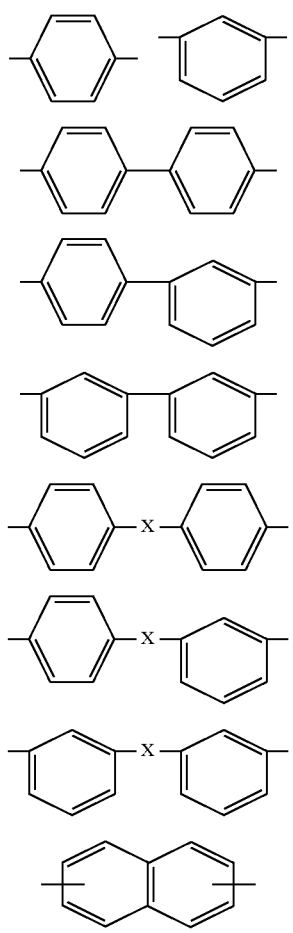

wherein X is —O—, —CH$_2$—, —SO$_2$—, —S— or —CO—. The aromatic polyamide referred to in the present invention includes those wherein part of the hydrogens in the aromatic ring can be substituted by a halogen group, nitro group, alkyl group, alkoxy group or the like. A para-orientation type aromatic polyamide is preferable to obtain a favorable mechanical performance, wherein more than 80 mol % of aromatic rings are bonded at para-positions. In this regard, the para-orientation type means that the bonding direction of backbone chains is oriented along para-positions in the aromatic rings, or the bonding directions of backbone chains at opposite ends of a residual group are coaxial or parallel to each other. Further, the invention relates to an aromatic polyamide wherein part of the hydrogen on the aromatic ring is substituted by halogen, especially by chlorine, to provide a material effective for improving the moisture absorption, dimensional stability in the moist state, or moldability of the film.

Typical para-orientation aromatic polyamides are, for example, poly(para-phenylene-terephthalamide) (hereinafter referred to as PPTA), chlorine-substituted PPTA and poly(para-benzamide).

The aromatic polyamide used in the present invention may be copolymerized with about 30 mol % or less of other groups than those described above, or blended with a small amount of another polymer for the purpose of improving the moldability. Unless a film characteristic is deteriorated or the objects of the present invention are contradicted, the aromatic polyamide used in the present invention may contain additives such as a filler, delusterant, ultraviolet light stabilizer, thermal stabilizer, antioxidant, pigment or solvent auxiliary.

A polymerization degree of a polymer forming a film according to the present invention is preferably one which provides an inherent viscosity ηinh (obtained by dissolving 0.1 g polymer in an 98% sulfuric acid of 150 ml and measuring at 35°) in a range from 2.5 to 8.5, more preferably from 3 to 7.5, because if it is too low, the resultant film has inferior mechanical properties, while, if it is too high, practical use is difficult.

The aromatic polyamide film according to the present invention is made of the above aromatic polyamide, and the thickness thereof is not limited to a particular range but may be optionally selected in accordance with the applications of the film. In general, the thickness may vary from 2 to 100 μm.

A strength of the film according to the present invention is preferably in a range from 15 kg/mm$^2$ to 80 kg/mm$^2$, more preferably from 20 kg/mm$^2$ to 70 kg/mm$^2$, for the purpose of preventing breakage during the treatment or handling thereof.

Also, an elastic modulus of the film is in a range from 1000 kg/mm$^2$ to 2500 kg/mm$^2$, preferably from 1200 kg/mm$^2$ to 2500 kg/mm$^2$ in an optional direction in a plane parallel to the film surface, for the purpose of avoiding useless deformation, by an external force, of an article finished to be suitable for a particular use. Particularly, a film having an elastic modulus of 1300 kg/mm$^2$ or more at least in one direction is favorable. If the elastic modulus exceeds 2500 kg/mm$^2$, there may be a problem in that the resistance to tearing is lowered to disturb a post-treatment of the film such as slitting.

The film of the present invention preferably has an elongation at breaking of at least 5%, more preferably 10% or more in an optional direction parallel to the film surface. Since the film becomes brittle, which worsens the processability thereof, if the elongation at break is lower than 5%, the elongation at break is preferably 5% or more in an optional direction which enhances treatment of the film, such as by slitting.

The density of the film according to the present invention is preferably in a range from 1.39 to 1.54 g/cm$^3$. This is because a film having such a relatively high density is excellent in dimensional stability against thermal and moist are variations, whereby it exhibits high performance in various applications for a long time while suppressing the fluctuation thereof. The density can be measured, for example, by a so-called density gradient tube method in carbon tetrachloride/toluene at 25° C. In fact, it was confirmed that the film according to one example of the present invention described later has a density in a range from 1.40 to 1.45 g/cm$^3$.

The film of the present invention has a proper irregularity on the surface thereof due to a specified amount of micro-particles contained therein. While varying in accordance with kinds and/or contents of micro-particles, an arithmetical mean deviation from the mean plane of the profile (Ra) of one surface of the film of the present invention is generally in a range from 0.0002 to 0.01 μm. When used as a base film for a high density recording medium, the film having Ra in a range from 0.0002 to 0.005 μm is preferably selected.

Projections forming the surface irregularity necessarily include micro-projections of a height in a range from 0.01 μm to 0.05 μm distributed at a distribution density (as expressed in terms of the number of projections/mm$^2$) in a range from 10$^2$ to 10$^7$/mm$^2$. If the distribution density of the micro-projections having the above-mentioned height is more than 10$^7$/mm$^2$, the slipperiness is somewhat improved but the surface smoothness is deteriorated. Also, if the distribution density is lower than $10^2/mm^2$, the slipperiness is also lowered. A film having the distribution density in a range from $10^3$ to $10^6/mm^2$ in terms of number of projections is particularly preferable.

The film of the present invention preferably has projections of a height in a range from 0.06 μm to 0.26 μm distributed at the distribution density as expressed in terms of the number of projections/mm$^2$) in a range from $1\times10^{-4}$ to $5\times10^3/mm^2$. The object of the present invention to provide a film excellent both in surface slipperiness and smoothness is conveniently achievable by the existence of the above-mentioned number of such projections having a so-called intermediate height. That is, the preference between the surface slipperiness and smoothness of the film can be optionally selected in the above density range in accordance with the uses to which the film is applied. For example, the slipperiness is improved if there are many intermediate projections (for example, in a range from $10^2$ to $10^3/mm^2$). Although such a film exhibits a rather poor smoothness when it is subjected, for example, to a vapor-deposition treatment, there is no problem at all regarding the surface smoothness if a magnetic material is coated on the film. Also, it is possible to obtain the desired slipperiness when there are no large projections referred to in the present invention by increasing the number of the intermediate projections. In such a manner, it was found that a film having a high surface smoothness is obtainable while maintaining a predetermined slipperiness by the control of the number of intermediate projections even if the number of large projections is substantially zero. If the distribution density of the projections having a height in a range from 0.06 to 0.26 μm is less than $1\times10^{-4}/mm^2$, the slipperiness generally becomes poor although it relies on the distribution density of large projections and/or micro-projections. On the other hand, if the distribution density of the intermediate projections on the film surface exceeds $5\times10^3/mm^2$, the smoothness becomes poor, which may cause a deterioration of the electromagnetic transducing characteristic if the film is used as a magnetic recording medium.

The distribution density of the projections having a height in a range from 0.05 μm to less than 0.27 μm is more preferably in a range from $1\times10^{-3}$ to $1\times10^3/mm^2$.

The film according to the present invention has, on at least one surface thereof, projections having a height in a range from 0.27 μm to less than 0.54 μm distributed at a distribution density in a range from 0 to 2/cm$^2$; projections of a height in a range from 0.54 μm to less than 0.81 at a distribution density in a range from 0 to 0.5/10 cm$^2$; and projections of a height of 0.81 μm or more at a distribution density from 0 to 0.1/100 cm$^2$. The present invention includes a film having none of these projections. If the distribution density of each of the above-classified projections exceeds the upper limit, a magnetic tape made of such a film may exhibit an unfavorable phenomena of the deterioration of electromagnetic transducing characteristic such as a lowering of output or an increase in dropouts and noise. Also, in the application wherein an inorganic substance is vapor-deposited by a sputtering method on the film surface, cracking or peeling may occur in the laminate when cooled at a room temperature after being treated at a high temperature. Particularly, the projection of a height exceeding 1.08 μm is preferably substantially zero.

The aromatic polyamide film according to the present invention can be prepared by a dry or wet type film formation system from an aromatic polyamide solution. It is important that the aromatic polyamide solution is prepared in such a manner that micro-particles are added to a solvent for the aromatic polyamide and dispersed thereinto, which dispersion is used as a solvent after being filtered, for dissolving or polymerizing the aromatic polyamide; the aromatic polyamide solution thus prepared being used for the film formation after filtration.

The micro-particles used for the film of the present invention are, for example, inorganic particles such as silica (silicon dioxide), calcium carbonate, titanium oxide, barium sulfate, calcium sulfate or alumina, and organic particles such as Teflon (polytetrafluoroethylene). Of them, particles of inorganic oxides which are inert to organic solvents or inorganic acids, such as silica, titanium oxide or alumina, are most preferable. One or more kinds of micro-particles may be contained in the film. A configuration of the micro-particle is preferably that of a sphere which has the smallest specific surface area and a low tendency for agglomeration; practically, that having a ratio of longer diameter/shorter diameter of 3 or less is preferably used, more preferably 1.5 or less. An average size of primary particulate of the micro-particles may be optionally selected in accordance with the concentrations thereof to be contained in the film, but in general, a size in a range from 0.005 to 0.3 μm is often used. The configuration of the micro-particle and/or the size of the primary particulate may be one kind or more.

The content of the micro-particles in the film of the present invention is in a range from 0.001 to 10% by weight relative to the polymer, preferably from 0.005 to 3% by weight. If the content is less than 0.001% by weight, the slipperiness is not improved at all and, on the contrary, if it exceeds 10% by weight, the further improvement of the slipperiness is not expected, but instead, the surface smoothness, transparency or mechanical strength of the film may be deteriorated.

The micro-particles may not be uniformly distributed in the thickness-wise direction of the film, provided they exist at least in one of the film surfaces and in the vicinity thereof. Both the satisfactory slipperiness and surface smoothness are achievable without any trouble when the micro-particles in a range from 0.001 to 10% by weight relative to the polymer as an average value in the thickness-wise direction of the film are contained solely in one film surface.

The micro-particles may exist in the film in various states ranging from that wherein they are completely divided into primary particulates to that wherein about twenty of them agglomerate as one particle.

The film formation method used for the present invention is not limited but may be selected to be suitable for individual polymers, provided the process for realizing the favorable state of micro-particles in the film as described later exists. With an aramid polymer soluble in an organic solvent, a film is formed by a dry or wet method from a solution of the polymer in the organic solvent, and with an aramid polymer insoluble in an organic solvent, the polymer is dissolved in a concentrated sulfuric acid or others to be a solution from which a film is formed by a wet method. According to the dry method, the solution is extruded from a die and cast onto a supporting body such as a metallic drum or an endless belt, and dried until the cast solution forms a self-supporting film. According to the wet method, the solution is directly extruded into a solidifying medium from a die or, after being cast onto a metallic drum or an endless belt in the same manner as the dry method, solidified in a solidifying medium.

Then, the films are rinsed to remove the solvent and/or inorganic salt contained therein and subjected to drawing, drying, heat treatment or others.

To obtain the film according to the present invention, it is necessary to mix and disperse the above-mentioned micro-particles. To do so, the micro-particles are preliminarily dispersed in a solvent of 1 poise or less. In this regard, preferably, the solvent is also preliminarily filtered through a filter capable of removing about 80% or more of 3 μm size particles or a filter capable of finer filtering. A favorable dispersing state in the solvent is such that a pressure rise of 0.1 kg/cm$^2$ or less occurs when the dispersion flows at a rate of 50 ml/cm$^2$·min through a filter capable of removing about 80% or more of 1 μm size particles.

The dispersing treatment may be preferably carried out, for example, by a dispersion mixer, ball mill, sand mill, ultrasonic homogenizer or the like. Of them, the ultrasonic homogenizer is particularly favorably used for this purpose, for example, under the conditions of an amplitude of the horn tip end in a range from 20 to 60 μm; a frequency in a range from 10 to 100 KHz and a processing amount per unit area of horn in a range from 0.1 to 20 cm$^3$ /min/cm$^2$, although such conditions may vary in accordance with an amount of micro-particles added to the solvent. Of course, another dispersion device may be combined therewith.

The amount of micro-particles to be added to the solvent is preferably 300 g/l or less, more preferably in a range from 1 to 100 g/l. If the amount of the micro-particles is excessive, they are difficult to disperse to provide a film according to the present invention. Contrarily, if the amount of the micro-particles is too small, the dispersing operation for obtaining the film of the present invention becomes too difficult.

The solvent in which the micro-particles are dispersed as described above is used as it is, preferably after being filtered through a filter capable of removing about 80% of 5 μm size particles, for dissolving the polymer, or after being diluted with the same solvent containing no micro-particles. Alternatively, the solvent may be added to the polymer solution and agitated to be mixed therewith. The polymer solution thus prepared is used for the film formation through a dry or wet method. The polymer concentration in the solvent is preferably in a range from 3 to 40% by weight. The polymer concentration or temperature is preferably adjusted so that the solution has a viscosity in a range from 10 to 10000 poises when being cast.

It is necessary to remove foreign matter such as dust and undispersed or reagglomerated micro-particles from the polymer solution prior to casting the polymer. A filter used therefor is one capable of removing about 80% of 5 μm size particles, preferably one capable of removing about 80% of 3 μm size particles. By such high precision filtration, not only the foreign matter but also the agglomerated micro-particles not removed in the preceding process can be removed, which enhances the surface smoothness of the film particularly because the large projections are prevented from being generated thereby. One of the most effective embodiments for carrying out such a high precision filtration is to use two or more stages of filters.

Also, liberated air entrapped during the dissolving process is preferably removed. Small air bubbles mixed in the solution are preferably removed as much as possible otherwise they may cause surface irregularities in the film. Deaeration may be carried out after the preparation of the solution, or all the processes for preparing the solution starting from the introduction of material may be carried out under a vacuum (subatmospheric) condition.

The polymer solution thus prepared is cast from a die such as a slit die onto a moving supporting surface. The casting and the subsequent solidification, rinsing, drawing and drying are preferably carried out in a continuous manner, but if necessary, all or part thereof may be separately carried out.

It is favorable to select a draft ratio (a ratio of a takeup rate of the supporting surface relative to a discharging rate of the die) of less than 5 for the purpose of achieving a satisfactory surface smoothness of the resultant film.

In the dry method, after being cast onto the supporting surface, the solution is dried to be a film until the same has a self-supporting ability, then the film is released from the supporting surface, and, if the dry-wet method is adopted, introduced into a bath. The bath is generally formed of an aqueous medium which may contain an organic solvent or an inorganic salt besides water. The remaining solvent and/or inorganic salt is removed in this bath.

On the other hand, according to the wet method, the solution cast onto the supporting surface is then solidified. Coagulants usable for the solution are selected in accordance with the kinds of solvents used, which are, for example, water, an aqueous solution of an organic solvent, sulfuric acid of about 75% by weight or less, an aqueous solution of sodium hydroxide of about 20% by weight or an aqueous solution of sodium sulfate or sodium chloride of about 10% by weight or less.

If the polymer solution is optically anisotropic, it is necessary to convert the same to an optically isotropic solution prior to the solidification. If the solution is solidified while being optically anisotropic, the resultant film is liable to tear in one direction and is practically unusable as a film. Conversion to the optical isotropy is preferably carried out after the solution is cast onto the supporting surface. If the polymer is PPTA, methods disclosed, for example, in Japanese Kokoku Nos. 3-52775, 2-57816 and 4-6738 and Japanese Kokai No. 63-99241 may be adopted.

Since the film obtained by solidifying the polymer solution contains the solvent if no process is adopted for removing the same, it is necessary to rinse the film to remove as much of the residual solvent as possible therefrom. The solvent is preferably removed until the residue becomes about 500 ppm or less. Cold water is usually used as a rinsing liquid. However, hot water may be used if necessary, rinsing is carried out with water or after the neutralization. The rinsing operation is carried out, for example, by running the film in the rinsing liquid or spraying the rinsing liquid onto the film.

The film thus rinsed may be drawn or relaxed. The drawing is most preferably carried out while utilizing the plasticizing effect of water, at a temperature of 80° C. or lower in the moist state. The drawing or relaxation may be uniaxial, simultaneously biaxial or sequentially biaxial. On the other hand, the relaxation is preferably carried out at a room temperature or in a heated environment of lower than 500° C. The draft or relaxation ratio is preferably in a range from 0.6 to 5 as a two-dimensional ratio, because there is a tendency that the higher the two-dimensional ratio, the higher the elastic modulus of the film but the lower the elongation at breaking. Particularly, the draft ratio in a range from 0.9 to 3 is more preferably used in view of a balance between the elastic modulus and the elongation at break, which ratio is considerably smaller than that used in the production of polyester film. Since a uniform quality film is not obtainable if the draft or relaxation rate is too large, the rate of 50%/sec or less is preferably selected.

In general, the drying and heat treatment are carried out under the heated condition in a range from 100° to 600° C. The drying and heat treatment are preferably separately carried out. Since voids may be generated in the film to deteriorate the surface smoothness and lower the elongation at break if the film is abruptly heated during the drying, it is preferably carried out at a temperature in a range from 100° to 300° C., particularly from 150° to 250° C. The heat treatment of the film may be carried out, if necessary, for the purpose of improving the elastic modulus and the thermal dimensional stability of the film. However, if the heat treatment temperature is too high, the polymer may be deteriorated to worsen the surface smoothness as well as deteriorate the mechanical properties of the film. Therefore, the heat treatment of the film is preferably carried out at a temperature in a range from 300° to 550° C., particularly from 350° to 500° C. The heat treatment time is preferably in a range from 0.5 seconds to 10 minutes. If this time is too short, a sufficient effect cannot be obtained, while if it is too long, the polymer may be deteriorated to worsen the surface smoothness as well as deteriorate the mechanical properties of the film. The heat treatment time in a range from 1.5 seconds to 3 minutes is particularly favorable. The heat treatment may be carried out either in a contact manner, for example, by a method wherein the film touches a temperature-controlled roll, or in a non-contact manner, for example, by using infrared rays or heat radiation from plate heaters.

A surface modification treatment may be applied to the film according to the present invention for the purpose of improving the affinity between the film surface and a resin. A corona discharge treatment or others have been known as the surface modification treatments. The corona discharge treatment is carried out by applying a high frequency and high voltage electric power between an electrode and a roll to generate a corona discharge, through which the film runs, so that the film surface is modified. Usually, the roll is a dielectric roll consisting of a metallic roll covered with a dielectric material such as hypolon (phonetic) rubber or silicone rubber, but in some cases, the discharge treatment may be carried out with no dielectric material between the electrodes. The discharge frequency is usually about 10 KHz but not limited thereto. A treatment density may be adjustable in accordance with film conditions or required adhesive forces, but usually in a range from 1 to 1000 W/m²/min, preferably from 10 to 5000 W/m²/min. If the treatment density is too high, the film properties may be deteriorated or the surface smoothness may be lost. The film according to the present invention is preferably produced in a so-called clean zone.

BEST MODES FOR CARRYING OUT THE INVENTION

Figure 1:
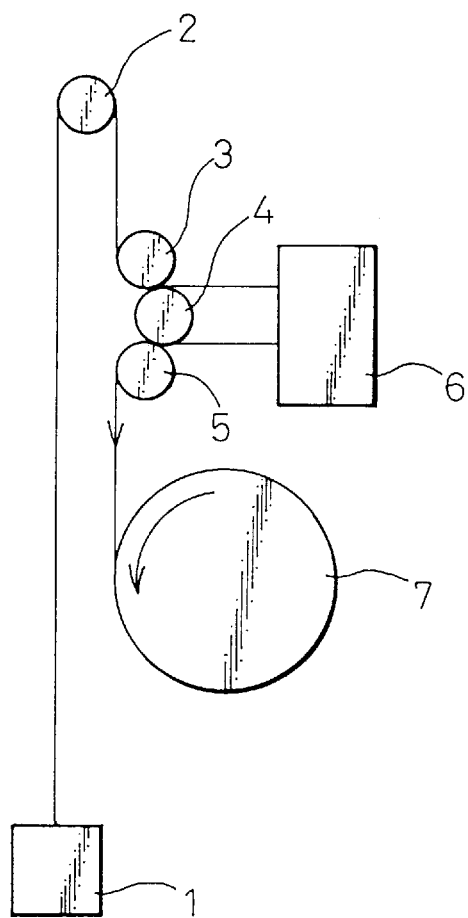
FIG. 1 is a schematic view of a device for measuring a dynamic frictional coefficient (nK) used for estimating the film slipperiness.

The present invention will be described below in more detail with reference to the preferred examples. Prior to the description of the examples, various measurements made thereon and conditions thereof will be explained.

(1) Measurement of Heights of Projections on the Film Surface

The film surface is uniformly vacuum-deposited with aluminum at a thickness of about 20 nm, an area of 100 cm² of which is observed through a halogen monochromatic multi-interference type reflective microscope (MN-11U provided by Nikon) at a magnification of 200 to obtain a size and number of projections per/unit area as an average value (n=10). The numbers of projections, which generate a primary interference fringe R1 (corresponding to a height in a range from 0.27 $\mu$m to less than 0.54 $\mu$m), a secondary interference fringe R2 (corresponding to a height in a range from 0.54 $\mu$m to 0.81 $\mu$m) and a tertiary interference fringe or higher (corresponding to a height of 0.81 $\mu$m or more), are counted.

(2) Diameters of Micro-Particles in Film

A cross-section of a film is observed by a transmission electron microscope (JEM2000FX provided from JEOL), and the diameters of particles existing in photographs of ten fields of view are measured.

(3) Arithmetical Mean Deviation from the Mean Plane of the Profile (Ra) and Distribution Density of Micro-particles Ra of a film and a distribution density of micro-projections according to the present invention are determined as follows:

Measuring Device: Three-dimensional micro-configuration measurement device ET-30K provided by Kosaka Kenkyujo A surface area of 100 $\mu$m×50 $\mu$m (X axis×Y axis) is measured five times at a magnification of 2×10⁵ by a probe of 0.5 $\mu$mR under conditions of a load of 0.05 mN or less, a cutoff of 0.025 mm, an X measurement length of 100 $\mu$m and a Y feed pitch of 0.2 $\mu$m, and an average of the measured values is used as an indication.

Arithmetical mean deviation from the mean plane of the profile (Ra)

Ra used herein is a three-dimensional expansion of a two-dimensional arithmetical mean deviation from the mean line of the profile (a so-called Ra), which is obtained by dividing the sum of volumes above the mean plane (mountain) and below the mean plane (valley) with an area of a reference plane. In other words, Ra is defined by the following equations when the X axis and Y axis of rectangular coordinates are defined on the mean plane, and the Z axis is defined as one extending vertical to the mean plane;

$$Ra = 1/S_M \int_0^{L_x} \int_0^{L_y} f(x, y) \, dx \, dy$$

$$S_M = L_x \times L_y$$

wherein f(x, y) represents a curved plane of roughness, and $L_x$ and $L_y$ represent the size of the reference plane.

Distribution density of micro-particles

This value is determined from the curved plane of roughness obtained, as follows, using MARMEC-3D provided by Kosaka Kenkyujo:

The distribution density of micro-projections having a height in a range from 0.01 to 0.05 $\mu$m is determined by counting the number of mountains when the curved plane of roughness is sliced at heights of 0.01 $\mu$m and 0.05 $\mu$m, respectively, by planes parallel to the mean plane thereof defined as a reference plane (height=0). Similarly, the distribution density of intermediate projections having a height in a range from 0.06 to 0.26 $\mu$m is determined.

(4) Measurement of Film Thickness, Strength, Elastic Modulus and Elongation at Break The film thickness is measured by a digital electronic micrometer (K351C provided by Anritsu K.K.) having a measuring surface of 2 mm diameter. The strength, elongation and elastic modulus are measured by a constant extension rate tensile tester (DDS-500 provided by Shimadzu Seisakusho) at a measurement length of 100 mm and an extension rate of 50 mm/min. The elastic modulus is calculated from the resultant SS curve in an elongation range from 0.05 to 0.25%.

(5) Dynamic Frictional Coefficient ($\mu$k)

FIG. 1 is a schematic view for illustrating the measurement of a dynamic frictional coefficient ($\mu$k) for the purpose of evaluating the slipperiness of film. In the drawing, reference numeral 1 denotes a weight (50 g); 2 a stationary guide pole (made of stainless steel of 6 mm diameter); 3, 4 and 5 free rollers; 6 a tension gauge; and 7 a takeup roller. As shown in FIG. 1, a film slitted into a strip of 2 cm wide runs at a speed of 3.3 cm/min while being wrapped around the guide pole 2 at π radian under the conditions at a temperature of 23° C. and a relative humidity of 55%. A film tension $T_2$ is measured at a position downstream of the guide pole.

The dynamic frictional coefficient μk between the stationary guide pole and the film is calculated by the following equation. In this regard, a length of film to be tested is 30 cm.

$$\mu k = 1/\pi \ln (T_2/50)$$

(6) Electromagnetic Transducing Characteristic

A vapor-deposited film is slitted into a strip of ½ inch wide and built into a VTR cassette to form a VTR tape. 100% chroma signals generated from a TV test waveshape generator (TG7-U706 provided by Shibasoku (phonetic)) are recorded on this tape by a home VTR, and chroma S/N is measured from regenerated signals thereof by a color noise tester (925D-1 provided by Shibasoku). Difference from Comparative Example 5 is represented in dB.

EXAMPLE 1

Silica particles (generally spherical; longer diameter/shorter diameter≈1.2) having a primary particulate size of 0.04 μm were added as micro-particles to a 99.8% concentrated sulfuric acid at a ratio of 54 g/l, which sulfuric acid was preliminarily filtered through a filter capable of removing about 80% of particles of 0.5 μm size. This concentrated sulfuric acid solution was treated for 2 hours with an agitator type homogenizer (5000 rpm) and then with an ultrasonic homogenizer of 40 μm amplitude and 20 KHz frequency at a rate per unit area of horn of 5 cm³/min/cm². Thereafter, the solution was diluted with pure 99.8% sulfuric acid so that the silica concentration was one tenth. Part of the diluted liquid was extracted and passed through a filter capable of removing about 80% or more of particles of 1 μm size for 10 minutes. The resultant pressure rise was 0.03 kg/cm². This diluted liquid was used for dissolving PPTA (ηinh=6). The concentration of PPTA was regulated to 12% by weight. An optically anisotropic PPTA/sulfuric acid solution thus prepared was filtered through a filter capable of removing about 80% or more of particles of 3 μm size, and then was cast onto an endless belt at a draft ratio of 3. Thereafter, the cast solution was blown with air having a temperature of about 105° C. and a dew point of 12° C. to be optically isotropic, and was guided together with the belt into a 50% sulfuric acid bath at 15° C. and solidified. Then, the solidified film was released from the belt, and sequentially passed through water at about 30° C., 0.1% NaOH aqueous solution, and again water at 30° C. for the purpose of rinsing. Then, the film was drawn by 15% in both the lengthwise and widthwise directions at room temperature and a rate of 1%/sec, and after being dried at 200° C. while maintaining a constant length, was subjected to a heat treatment for 10 seconds at 440° C. while maintaining a constant length to result in a final film of 6 μm thick. The mechanical properties of the resultant film are as follows: the elastic modulus of 1700 kg/mm², the strength of 35 kg/mm² and the elongation at break of 21%. Other properties of the film are listed in Table 1.

A magnetic tape was prepared by forming a ferromagnetic metallic thin film of Co—Ni (Ni=20% by weight, a film thickness of 180 nm) on the film surface by a continuous slanted vacuum evaporation method in an atmosphere wherein a very small amount of oxygen is present. Thereafter, the dynamic frictional coefficient and the electromagnetic transducing characteristic were measured. As shown in Table 1, the tape having a small frictional coefficient and an excellent electromagnetic transducing characteristic was obtained.

EXAMPLE 2

A dispersion treatment was carried out under the same conditions as those in Example 1, except that the primary particulate size of micro-particles is 0.1 μm and the amount of micro-particles to be added to the concentrated sulfuric acid was 1.4 g/l, and the solution was diluted to one tenth of the precursor solution. Part of this diluted liquid was extracted and passed through a filter capable of removing about 80% of particles of 1 μm size for 10 minutes at a flow rate of 50 ml/cm²·min. The resultant pressure rise was 0.08 kg/cm². A film of 6 μm was prepared while using this diluted liquid in the same manner as Example 1. The mechanical properties of the resultant film are as follows: the elastic modulus of 1750 kg/mm², the strength of 42 kg/mm² and the elongation at break of 25%. Other properties of the film are listed in Table 1. The dynamic frictional coefficient and the electromagnetic transducing characteristic were measured after a magnetic tape was prepared from this film in the same manner as Example 1. The magnetic tape exhibited a good performance as shown in Table 1.

EXAMPLE 3

A dispersion treatment was carried out under the same conditions as those in Example 1, except that the primary particulate size of micro-particle was 0.02 μm and the amount of micro-particles to be added to the concentrated sulfuric acid was 720 g/l, and the solution was diluted to one tenth. Part of this diluted liquid was extracted and passed through a filter capable of removing about 80% or more of particles of 1 μm size for 10 minutes at a flow rate of 50 ml/cm²·min. The resultant pressure rise was 0.07 kg/cm². A film of 6 μm was prepared while using this diluted liquid in the same manner as Example 1. The mechanical properties of the resultant film are as follows: the elastic modulus of 1700 kg/mm², the strength of 30 kg/mm² and the elongation at break of 6%. Other properties of the film are listed in Table 1. The dynamic frictional coefficient and the electromagnetic transducing characteristic were measured after a magnetic tape was prepared from this film in the same manner as Example 1. The magnetic tape was excellent in electromagnetic transducing characteristic and in slipperiness as shown in Table 1.

Comparative Example 1

For the purpose of comparison, a dispersion treatment was carried out under the same conditions as those in Example 1, except that the primary particulate size of micro-particle was 0.04 μm and the amount of micro-particles to be added to the concentrated sulfuric acid was 0.09 g/l, and the solution was diluted to one tenth. Part of this diluted liquid was extracted and passed through a filter, capable of removing about 80% of particles of 1 μm size, for 10 minutes at a flow rate of 50 ml/cm²·min. The resultant pressure rise was 0.02 kg/cm². A film of 6 μm was prepared while using this diluted liquid in the same manner as Example 1. The mechanical properties of the resultant film are as follows: the elastic modulus of 1750 kg/mm², the strength of 40 kg/mm² and the elongation at break of 23%.

Other properties of the film are listed in Table 1. The dynamic frictional coefficient and the electromagnetic transducing characteristic were measured after a magnetic tape was prepared from this film in the same manner as Example 1. The results were listed in Table 1. The dynamic frictional coefficient of this tape was large and the electromagnetic transducing characteristic could not be measured as shown in Table 1.

Comparative Example 2

For the purpose of comparison, a dispersion treatment was carried out under the same conditions as those in Example 1, except that the primary particulate size of micro-particles was 0.02 μm and the amount of micro-particles to be added to the concentrated sulfuric acid was 2700 g/l, and the solution was diluted to one tenth. Part of this diluted liquid was extracted and passed through a filter capable of removing about 80% of particles of 1 μm size for 10 minutes at a flow rate of 50 ml/cm$^2$·min. The resultant pressure rise was 1.2 kg/cm$^2$. A film of 6 μm was prepared while using this diluted liquid in the same manner as Example 1. The mechanical properties of the resultant film are as follows: the elastic modulus of 1700 kg/mm$^2$, the strength of 32 kg/mm$^2$ and the elongation at break of 4%. Other properties of the film are listed in Table 1.

The dynamic frictional coefficient and the electromagnetic transducing characteristic were measured after a magnetic tape was prepared from this film in the same manner as Example 1. The results are listed in Table 1. The dynamic frictional coefficient of this tape was μk=0.10 which means that the slipperiness is very satisfactory, but the electromagnetic transducing characteristic is unsatisfactory. In addition, since the film surface was rough, a magnetic head of a VTR was harmed. According to the observation of the tape surface by a scanning type electron microscope, it was found that the magnetic layer of the tape was peeled off from the base film.

tenth. Part of the diluted liquid was extracted and passed through a filter capable of removing about 80% of particles of 1 μm size for 10 minutes. The resultant pressure rise was 0.02 kg/cm$^2$. After being filtered through a filter capable of removing about 80% of particles of 3 μm size, this diluted liquid was used for dissolving PPTA (ηinh=7). The concentration of PPTA was regulated to 11% by weight. An optically anisotropic PPTA/sulfuric acid solution thus prepared was filtered through a filter capable of removing about 80% of particles of 3 μm size, and then was cast onto an endless belt at a draft ratio of 1. Thereafter, the cast solution was blown with air having a temperature of about 105° C. and a dew point of 15° C. to be optically isotropic, and was guided together with the belt into a 60% sulfuric acid bath at 15° C. and solidified. Then, the solidified film was released from the belt, and sequentially passed through water at about 30° C., a 0.1% NaOH aqueous solution, and again water at 30° C. for the purpose of rinsing. Then, the film was drawn by 10% in both the lengthwise and widthwise directions at room temperature and a rate of 0.1%/sec, and after being dried at 200° C. while maintaining a constant length, was subjected to a heat treatment in the tensioned state for 20 seconds at 400° C. to result in a final film of 50 μm thick. The mechanical properties of the resultant film are as follows: the elastic modulus of 1200 kg/mm$^2$, the strength of 35 kg/mm$^2$ and the elongation at break of 40%. Other properties of the film are listed in Table 2.

A stainless steel layer of 1000 Å thick was formed on the resultant film in a sputtering device from a stainless steel target. Then, the film was placed on a support electrode in a vacuum reactor which then was evacuated once to a vacuum in a range from 10 to 50 Torr. After the temperature of the support electrode was elevated to 300° C., argon gas was introduced into the vacuum reactor while applying a high frequency voltage of 30 W and 13.56 MHz to the support electrode and an opposed electrode, whereby the presputtering was carried out in an argon gas atmosphere of 1 Torr. Then, SiH$_4$ diluted with hydrogen gas to 10% and

TABLE 1

| | Content of micro-particles (% by weight) | Average particle size in film (μm) | Ra (nm) | Density of projections of 0.01 to 0.05 μm size (/mm$^2$) | Density of projections of 0.06 to 0.26 μm size (/mm$^2$) | Density of large projections | | | Dynamic frictional coefficient | Electromagnetic transducing characteristic S/N (dB) |
|---|---|---|---|---|---|---|---|---|---|---|
| | | | | | | 1R (/cm$^2$) | 2R (/10 cm$^2$) | 3R (/100 cm$^2$) | | |
| Ex. 1 | 0.3 | 0.09 | 1.0 | 6 × 10$^5$ | 20 | 1.5 | 0.3 | ≦0.1 | 0.20 | 3.5 |
| Ex. 2 | 0.008 | 0.11 | 0.5 | 2 × 10$^4$ | 3 | 4 | 1 | 0.1 | 0.15 | 2.5 |
| Ex. 3 | 4.0 | 0.15 | 7.0 | 8 × 10$^6$ | 7 × 10$^2$ | 4.8 | 1.7 | 0.3 | 0.10 | 2.0 |
| Com. Ex. 1 | 0.0005 | 0.042 | 0.1 | 9 × 10 | 4 × 10$^{-4}$ | 0.4 | 0.1 | ≦0.1 | 0.55 | not measured |
| Com. Ex. 2 | 15.0 | 0.40 | 18.0 | 3 × 10$^7$ | 2 × 10$^5$ | 20 | 8 | 5 | 0.10 | −4.0 |

EXAMPLE 4

Silica particles (generally spherical; longer dia./shorter dia.≈1.2) having a primary particulate size of 0.04 μm were added as micro-particles to a 99.8% concentrated sulfuric acid at a ratio of 9 g/l, which sulfuric acid was preliminarily filtered through a filter capable of removing about 80% of particles of 0.1 μm size. This concentrated sulfuric acid solution was treated for 24 hours with an agitator type homogenizer (10000 rpm) and then left stationary for 12 hours. An upper part of this solution was extracted and treated with an ultrasonic homogenizer of 30 μm amplitude and 4 KHz frequency at a rate per unit area of horn of 10 cm$^3$/min/cm$^2$. Thereafter, the solution was diluted with pure 99.8% sulfuric acid so that the silica concentration is one PH$_3$ gas also diluted with hydrogen gas to 1% were introduced thereinto to form an n type amorphous silicon layer of 200 Å thick on the film in an atmosphere of 0.8 Torr. Subsequently, SiH$_4$ was solely introduced so that an i type amorphous silicon layer of 6000 Å thick was laminated thereon. Further, SiH$_4$ gas containing 1% of B$_2$H$_6$ was introduced to form a p type amorphous silicon layer of 200 Å thick.

Then, the film carrying a thus-formed pin type amorphous silicon semiconductor layer was placed in a vacuum evaporation device to vacuum-deposit an indium oxide layer of 1000 Å thick by an electron beam method as a heteroface layer. Finally, a comb-shaped palladium layer of 1000 Å thick was vacuum-deposited thereon to result in a film-like solar cell.

After the resultant solar cell was alternately placed five times in environments maintained at room temperature and 200° C., respectively, for 10 minutes, the amorphous silicon layer was observed in ten fields of view of a scanning type electron microscope (S570 provided by Hitachi Seisakusho) at a magnification of 15000. As shown in Table 2, there are no cracks at all, suggesting that a solar cell having an excellent electromagnetic transducing characteristic will be produced.

Comparative Example 3

For the purpose of comparison, micro-particles at 90 g/l were added to concentrated sulfuric acid, then treated in the agitating type homogenizer at 10000 rpm for 24 hours, and the sulfuric acid solution was diluted so that the concentration of micro-particles was one tenth. Part of this diluted liquid was extracted and passed through a filter capable of removing about 80% of particles of 1 $\mu$m size at a flow rate of 50 ml/cm$^2$·min for ten minutes. The resultant pressure rise was 0.8 kg/cm$^2$. A film of 50 $\mu$m thickness was obtained in the same manner as Example 4 except for using this diluted liquid. The mechanical properties of the resultant film were as follows: the elastic modulus of 1300 kg/mm$^2$; the strength of 42 kg/mm$^2$; and the elongation at break of 38%. Other properties of the film are listed in Table 2. The amorphous silicon layer was observed by a scanning type electron microscope after a solar cell prepared in the same manner as Example 4 was alternately placed five times in the environments maintained at room temperature and 200° C., respectively, for 10 minutes. As shown in Table 2, there are many cracks in the amorphous silicon layer, a cause of which may be the generation of too many large projections.

EXAMPLE 5

A film of 50 $\mu$m thick was obtained in the same film formation process as that of Example 4 except that the heat treatment is carried out at 420° C. for 20 minutes. The mechanical properties of the resultant film were as follows: the elastic modulus of 1450 kg/mm$^2$; the strength of 25 kg/mm$^2$; and the elongation at break of 7%. Other properties of the film are listed in Table 2. The amorphous silicon layer was observed by a scanning type electron microscope after a solar cell prepared in the same manner as Example 4 was alternately placed five times in the environments maintained at room temperature and 200° C., respectively, for 10 minutes. As shown in Table 2, a favorable result is obtained in that cracks were hardly generated in the amorphous silicon layer.

Comparative Example 4

For the purpose of comparison, a film of 50 $\mu$m thick was obtained in the same film formation process as that of Example 4 except that the heat treatment is carried out simultaneously with the drying at 400° C. for 20 minutes. The mechanical properties of the resultant film were as follows: the elastic modulus of 1550 kg/mm$^2$; the strength of 28 kg/mm$^2$; and the elongation at break of 10%. Other properties of the film are listed in Table 2. The amorphous silicon layer was observed by a scanning type electron microscope after a solar cell prepared in the same manner as Example 4 was alternately placed five times in the environments maintained at room temperature and 200° C., respectively, for 10 minutes. As shown in Table 2, there were many large projections in the amorphous silicon layer because the drying and the heat treatment were simultaneously carried out.

TABLE 2

| | Content of micro-particles (% by weight) | Average particle size in film ($\mu$m) | Ra (nm) | Density of projections of 0.01 to 0.05 $\mu$m size (/mm$^2$) | Density of projections of 0.06 to 0.26 $\mu$m size (/mm$^2$) | Density of large projections | | | Dynamic frictional coefficient | Cracks |
|---|---|---|---|---|---|---|---|---|---|---|
| | | | | | | 1R (/cm$^2$) | 2R (/10 cm$^2$) | 3R (/100 cm$^2$) | | |
| Ex. 4 | 0.05 | 0.05 | 0.8 | 1 × 10$^5$ | 1 × 10$^3$ | 0.1 | ≦0.1 | ≦0.1 | 0.18 | ⊙ |
| Com. Ex. 3 | 0.50 | 0.10 | 4.0 | 7 × 10$^5$ | 1 × 10$^2$ | 5 | 4 | 2.5 | 0.12 | x |
| Ex. 5 | 0.05 | 0.05 | 3.5 | 1 × 10$^5$ | 8 × 10$^2$ | 4 | 1.5 | 0.3 | 0.17 | o |
| Ex. 6 | 0.05 | 0.05 | 4.0 | 1 × 10$^5$ | 50 | 4.5 | 1.8 | 0.4 | 0.17 | o |
| Com. Ex. 4 | 0.05 | 0.05 | 4.0 | 1 × 10$^5$ | 6 | 5.5 | 2.7 | 3 | 0.10 | x |

Note:
Evaluation of crack generation
⊙: No cracks generated at all
o: Cracks generated in one to five portions
x: Cracks generated in more than five portions treatment is carried out simultaneously with the drying at 400° C. for 5 minutes. The mechanical properties of the resultant film were as follows: the elastic modulus of 1350 kg/mm$^2$; the strength of 45 kg/mm$^2$; and the elongation at break of 20%. Other properties of the film are listed in Table 2. The amorphous silicon layer was observed by a scanning type electron microscope after a solar cell prepared in the same manner as Example 4 was alternately placed five times in the environments maintained at room temperature and 200° C., respectively, for 10 minutes. As shown in Table 2, a favorable result is obtained in that cracks were hardly generated in the amorphous silicon layer.

EXAMPLE 6

A film of 50 $\mu$m thick was obtained in the same film formation process as that of Example 4 except that the heat

EXAMPLE 7

A film of 4 $\mu$m thick was obtained under the same conditions as those in Example 1, except that the concentrated sulfuric acid in which silica particles were dispersed was continuously filtered through a filter capable of removing about 80% of particles of 1 $\mu$m size, the optically anisotropic PPTA/sulfuric acid solution was initially filtered through a filter capable of removing particles of 5 $\mu$m size and then through a filter capable of removing about 80% of particles of 3 $\mu$m size, the takeup rate of the endless belt was somewhat increased, and the film was once rinsed with an aqueous solution of carbonic acid of pH=4.5 after being once rinsed with an aqueous solution of NaOH. The mechanical properties of the resultant film were as follows: the elastic modulus of 1820 kg/mm$^2$; the strength of 45 kg/mm$^2$; and the elongation at break of 11%. Other properties of the film are listed in Table 3 which shows that the film has a very good electromagnetic transducing characteristic and maintains a necessary level of slipperiness.

Comparative Example 5

Example 1 disclosed in Japanese Kokoku No. 5-36849 was repeated for comparison. Distillated and dehydrated N-methylpyrolidone was added to refined 2-chloro-paraphenylenediamine and methaphenylenediamine and agitated to be dissolved thereinto, and the solution was cooled at 0° C. Refined powdery terephthalic chloride was added to this solution and agitated for 2 hours, and thereafter, sufficiently refined calcium hydroxide was added thereto and agitated for one hour at room temperature to neutralize the same so that a transparent aromatic polyamide solution having a predetermined composition was obtained. On the other hand, ultrafine silica having a 20 μm particle size of 2% by weight was added to another distilled N-methylpyrolidone, which was then filtered after being treated by an agitating type homogenizer for 10 hours. This inorganic particle solution was added to the above-described polymer solution in an amount of 0.5% by weight as a solid content relative to the polymer and mixed therewith to result in a homogeneous solution. This solution was uniformly cast onto a metallic drum having a polished surface at about 30° C. and dried in a 120° C. atmosphere for 10 minutes. The film was released from the drum and continuously drawn 1.3 times in the machine direction while being dipped in a water bath at 30° C. Further, the film was introduced into a tenter and drawn 1.4 times in the transverse direction at 300° C. to result in a transparent film of 20 μm thickness. Properties of the resultant film and a magnetic tape prepared therefrom under the same conditions as those in Example 1 are listed in Table 3 which shows that there were many large projections to deteriorate the electromagnetic transducing characteristic.

Comparative Example 6

Example 1 disclosed in Japanese Kokai No. 2-133434 was repeated for comparison. 99.6% sulfuric acid was added to SiO$_2$ particles having a primary particulate size of 0.20 μm and strongly agitated to form a dispersion. A proportion of SiO$_2$ relative to PPTA to be dissolved in the dispersion was 0.1% by weight. Then, PPTA was dissolved in this dispersion so that the polymer concentration became 12% by weight to result in a dope having an optical anisotropy at 60° C. The dope had a viscosity of 9500 poises at about 30° C. The dope was deaerated under the vacuum condition for about 4 hours at a temperature in a range from 55° to 60° C., and after being fed to a stationary type mixer from a tank, passed through a 1.5 m long curved pipe for connecting a gear pump with a die and maintained at about 70° C. Then, the dope was cast from the die onto a mirror-finished belt made of tantalum from a die having a slit of 0.15 mm×250 mm, and exposed to an air stream having a relative humidity of about 85% and a temperature of about 90° C. to be optically isotropic. Next, the dope was introduced together with the belt into an aqueous solution of sulfuric acid of 30% by weight at 0° C. and solidified. The solidified film was released from the belt and passed through hot water of about 40° C. for the purpose of rinsing. The rinsed film was drawn by 1.15 times both in the machine direction and the transverse direction with a tenter, then dried by hot air at 200° C. Thereafter, the film was heat-treated at 350° C. with a hot plate at a constant length to be a final film of 6 μm thick. Properties of the resultant film and a magnetic tape made therefrom under the same conditions as those of Example 1 are listed in Table 3 which shows that there were many large projections to deteriorate the electromagnetic transducing characteristic of the magnetic tape.

Comparative Example 7

Example 1 disclosed in Japanese Kokai No. 4-298324 was repeated for comparison. As an aromatic diamine component, 2-chloro-paraphenylenediamine corresponding to 90 mol % and 4,4 diaminodiphenylether corresponding to 10 mol % were dissolved into N-methylpyrolidone. Further, 2-chloroterephthaloyl chloride corresponding to 100 mol % was added thereto and agitated together for 2 hours to complete the polymerization. The resultant product was neutralized with lithium hydroxide to obtain an aromatic polyamide solution having a polymer concentration of 10% by weight and a viscosity of 2800 poises. To this solution was added spherical silica particles of 0.1 μm size in an amount of 0.5% by weight relative to the polymer. The polymer solution was cast onto a belt after passing through a filter of 10 μm cut, and heated with a hot air at 180° C. for 2 minutes to evaporate the solvent and result in a self-supporting film which then was continuously released from the belt. Then, the film was introduced into a water bath to extract the residual solvent and inorganic salts generated due to the neutralization, and dried and heat-treated in a tenter to result in an aromatic polyamide film of 9 μm thick. This film was drawn 1.2 and 1.3 times in the lengthwise and widthwise directions, respectively, and after being subjected to a heat treatment at 280° C. for 1.5 minutes, rapidly cooled. Properties of the resultant film and a magnetic tape made therefrom under the same conditions as those of Example 1 are listed in Table 3 which shows that the distribution density of the projections on the film surface is out of range defined by the present invention due to the insufficient dispersion of micro-particles and the incomplete filtration of liquid material, and therefore the performance as a magnetic tape was inferior.

TABLE 3

| | Content of micro-particles (% by weight) | Average particle size in film (μm) | Ra (nm) | Density of projections of 0.01 to 0.05 μm size (/mm$^2$) | Density of projections of 0.06 to 0.26 μm size (/mm$^2$) | Density of large projections | | | Dynamic frictional coefficient | Electro-magnetic transducing characteristic S/N (dB) |
|---|---|---|---|---|---|---|---|---|---|---|
| | | | | | | 1R (/cm$^2$) | 2R (/10 cm$^2$) | 3R (/100 cm$^2$) | | |
| Ex. 7 | 0.3 | 0.08 | 0.8 | 3 × 10$^5$ | 20 | 0.7 | 0.2 | ≦0.1 | 0.22 | 3.8 |
| Com. Ex. 5 | 0.5 | 0.12 | 1.1 | 9 × 10$^5$ | 8 × 10$^3$ | 8 | 4 | 0.7 | 0.19 | 0 |
| Com. Ex. 6 | 0.1 | 0.25 | 19.0 | 1 × 10$^5$ | 8 × 10$^4$ | 60 | 24 | 10 | 0.10 | −4.0 |
| Com. Ex. 7 | 0.5 | 0.15 | 6.0 | 2 × 10$^5$ | 4 × 10$^4$ | 80 | 20 | 1.5 | 0.15 | −2.5 |

CAPABILITY OF EXPLOITATION IN INDUSTRY

The film according to the present invention is an aromatic polyamide film having both satisfactory slipperiness and surface smoothness which were thought to be incompatible with each other. Also it has good mechanical properties represented by a high strength and a favorable elastic modulus as well as an excellent electro-insulation property, a resistance to heat, a resistance to chemical and a resistance to climate. Accordingly, the film of the present invention is suitably used as an electro-insulating material for a high rotational speed electric appliance, a base film for a solar cell, a flexible printed circuit board, a thermal transfer printer tape, or a sheath of electric wire.

In addition, since the film according to the present invention has a high elastic modulus, a good slipperiness and a favorable surface smoothness, it is particularly useful for a base film of a recording medium such as a video tape, computer tape or audio tape, or a substrate on which sputtering or vapor-deposition is performed.

We claim:

1. An aromatic polyamide film containing micro-particles in an amount in a range from 0.001 to 10% by weight, characterized in that, at least on one film surface, a distribution density of projections having a height in a range from 0.01 $\mu$m to 0.05 $\mu$m is in a range from $10^2$ to $10^7/mm^2$; that of projections having a height in a range from 0.06 $\mu$m to 0.26 $\mu$m is in a range from 3 to $5\times10^3/mm^2$; that of projections having a height in a range from 0.27 $\mu$m to less than 0.54 $\mu$m is in a range from 0 to $5/cm^2$; that of projections having a height in a range from 0.54 $\mu$m to less than 0.81 $\mu$m is in a range from 0 to $2/10\ cm^2$; and that of projections having a height of 0.81 $\mu$m or more is in a range from 0 to $0.5/100\ cm^2$.

2. An aromatic polyamide film as defined by claim 1, wherein, on the film surface, a distribution density of projections having a height in the range from 0.06 $\mu$m to 0.26 $\mu$m is in a range from $1\times10^{-3}$ to $1\times10^3/mm^2$.

3. An aromatic polyamide film as defined by claim 1, wherein, on the film surface, the distribution density of projections having a height in the range from 0.27 $\mu$m to less than 0.54 $\mu$m is in a range from 0 to $2/cm^2$; that of projections having a height in the range from 0.54 $\mu$m to less than 0.81 $\mu$m is in a range from 0 to $0.5/10\ cm^2$; and that of projections having a height of 0.81 $\mu$m or more is in a range from 0 to $0.1/100\ cm^2$.

4. An aromatic polyamide film as defined by claim 1, wherein an average primary particulate size of the micro-particles is in a range from 0.005 to 0.3 $\mu$m.

5. An aromatic polyamide film as defined by claim 1, wherein the film has the following properties: a strength in a range from 15 $kg/mm^2$ to 80 $kg/mm^2$, an elastic modulus in an optional direction in a plane parallel to a surface of the film in a range from 1000 $kg/mm^2$ to 2500 $kg/mm^2$, and an elongation at break in an optional direction in a plane parallel to the surface of the film of at least 5%.

6. An aromatic polyamide film as defined by any one of the preceding claims, wherein the aromatic polyamide is a para-oriented aromatic polyamide.

7. An aromatic polyamide film as defined by any one of claims 1 to 5, wherein the aromatic polyamide is poly(para-phenylene-terephthalamide).

8. An aromatic polyamide film as defined by any one of claims 1 to 5, wherein the aromatic polyamide is chlorine-substituted poly(para-phenylene-terephthalamide) or a polyamide containing about 70 mol % or more thereof.

9. A magnetic recording medium comprising: a non-magnetic flexible support carrying a magnetic layer thereon, wherein the support is an aromatic polyamide film containing micro-particles in an amount in a range from 0.001 to 10% by weight, characterized in that, at least on one film surface, a distribution density of projections having a height in a range from 0.01 $\mu$m to 0.05 $\mu$m is in a range from $10^2$ to $10^7/mm^2$; that of projections having a height in a range from 0.06 $\mu$m to 0.26 $\mu$m is in a range from 3 to $5\times10^3/mm^2$; that of projections having a height in a range from 0.27 $\mu$m to less than 0.54 $\mu$m is in a range from 0 to $5/cm^2$; that of projections having a height in a range from 0.54 $\mu$m to less than 0.81 $\mu$m is in a range from 0 to $2/10\ cm^2$; and that of projections having a height of 0.81 $\mu$m or more is in a range from 0 to $0.5/100\ cm^2$.

10. A magnetic recording medium as defined by claim 9, wherein, on the film surface, a distribution density of projections having a height in a range from 0.06 $\mu$m to 0.26 $\mu$m is in a range from $1\times10^{-3}$ to $1\times10^3/mm^2$.

11. A magnetic recording medium as defined by claim 9 or 10, wherein the aromatic polyamide is a para-oriented aromatic polyamide.

12. A magnetic recording medium as defined by claim 9 or 10, wherein the aromatic polyamide is poly(para-phenylene-terephthalamide).

13. A magnetic recording medium as defined by claim 9 or 10, wherein the aromatic polyamide is a chlorine-substituted poly(para-phenylene-terephthalamide) or a polyamide containing about 70 mol % or more thereof.

14. A solar cell comprising: a flexible film substrate carrying an amorphous silicon film thereon as an element for a photo-excitation power source, wherein the substrate is an aromatic polyamide film containing micro-particles in an amount in a range from 0.001 to 10% by weight, characterized in that, at least on one film surface, a distribution density of projections having a height in a range from 0.01 $\mu$m to 0.05 $\mu$m is in a range from $10^2$ to $10^7/mm^2$; that of projections having a height in a range from 0.06 $\mu$m to 0.26 $\mu$m is in a range from 3 to $5\times10^3/mm^2$; that of projections having a height in a range from 0.27 $\mu$m to less than 0.54 $\mu$m is in a range from 0 to $5/cm^2$; that of projections having a height in a range from 0.54 $\mu$m to less than 0.81 $\mu$m is in a range from 0 to $2/10\ cm^2$; and that of projections having a height of 0.81 $\mu$m or more is in a range from 0 to $0.5/100\ cm^2$.

15. A solar cell as defined by claim 14, wherein, on the film surface, a distribution density of projections having a height in a range from 0.06 $\mu$m to 0.26 $\mu$m is in a range from 3 to $1\times10^3/mm^2$.

16. A solar cell as defined by claim 14 or 15, wherein the aromatic polyamide is a para-oriented aromatic polyamide.

17. A solar cell as defined by claim 14 or 15, wherein the aromatic polyamide is poly(para-phenylene-terephthalamide).

18. A solar cell as defined by claim 14 or 15, wherein the aromatic polyamide is a chlorine-substituted poly(para-phenylene-terephthalamide) or a polyamide containing about 70 mol % or more thereof.

19. A method for producing an aromatic polyamide film by a dry or wet film formation system from an aromatic polyamide solution, comprising: adding inorganic or organic micro-particles in a solvent for preparing the solution; sufficiently dispersing the micro-particles in the solvent; preparing the aromatic polyamide solution using the dispersion of the micro-particles as a solvent after the dispersion has been filtered; and forming the film from the solution after the solution has been filtered.

20. A method for producing an aromatic polyamide film as defined by claim 19, wherein the aromatic polyamide is a para-oriented type aromatic polyamide.

21. A method for producing an aromatic polyamide film as defined by claim 19, wherein the aromatic polyamide is poly(para-phenylene-terephthalamide).

22. A method for producing an aromatic polyamide film as defined by claim 19, wherein the aromatic polyamide is a chlorine-substituted poly(para-phenylene-terephthalamide) or a polyamide containing about 70 mol % or more thereof.

* * * * *

UNITED STATES PATENT AND TRADEMARK OFFICE
CERTIFICATE OF CORRECTION

PATENT NO. : 5,853,907
DATED : December 29, 1998
INVENTOR(S) : Takashi YAMADA et al.

It is certified that error appears in the above-indentified patent and that said Letters Patent is hereby corrected as shown below:

Claim 2, Col. 21, line 40, "$1 \times 10^{-3}$" should read --3--.

Claim 8, Col. 22, line 2, after "is", insert --a--.

Claim 10, Col. 22, line 24, "$1 \times 10^{-3}$" should read --3--.

Claim 20, Col. 23, line 13, after "para-oriented", delete "type".

Signed and Sealed this

Nineteenth Day of October, 1999

*Attest:*

Q. TODD DICKINSON

*Attesting Officer*  Acting Commissioner of Patents and Trademarks